United States Patent
Ruan et al.

(10) Patent No.: US 8,729,492 B2
(45) Date of Patent: May 20, 2014

(54) METHODS, DEVICES, AND SYSTEMS FOR MANIPULATING CHARGED PARTICLE STREAMS

(75) Inventors: Junru Ruan, Hillsboro, OR (US); John G. Hartley, Clifton Park, NY (US); Gregory Denbeaux, Albany, NY (US)

(73) Assignee: The Research Foundation for The State University of New York, Albany, NY (US)

(*) Notice: Subject to any disclaimer, the term of this patent is extended or adjusted under 35 U.S.C. 154(b) by 0 days.

(21) Appl. No.: 13/809,902

(22) PCT Filed: Jul. 20, 2011

(86) PCT No.: PCT/US2011/044703
§ 371 (c)(1),
(2), (4) Date: Mar. 20, 2013

(87) PCT Pub. No.: WO2012/012548
PCT Pub. Date: Jan. 26, 2012

(65) Prior Publication Data
US 2013/0193341 A1 Aug. 1, 2013

Related U.S. Application Data

(60) Provisional application No. 61/366,064, filed on Jul. 20, 2010.

(51) Int. Cl.
*H01J 37/147* (2006.01)
*H01J 37/30* (2006.01)
*H01J 37/04* (2006.01)

(52) U.S. Cl.
USPC ............ 250/396 R; 250/492.23; 250/306; 250/307; 250/492.2; 250/492.3

(58) Field of Classification Search
USPC ............ 250/396 R, 306, 307, 492.23, 492.2, 250/492.3
See application file for complete search history.

(56) References Cited

U.S. PATENT DOCUMENTS

| | | | |
|---|---|---|---|
| 3,638,015 A | 1/1972 | Browning et al. | |
| 4,649,316 A | 3/1987 | Cleaver et al. | |
| 4,755,685 A | 7/1988 | Kawanami et al. | |
| 5,051,556 A * | 9/1991 | Sakamoto et al. | 219/121.25 |
| 6,940,080 B2 * | 9/2005 | Nagano et al. | 250/492.23 |
| 7,928,404 B2 * | 4/2011 | Parker | 250/396 R |

(Continued)

OTHER PUBLICATIONS

International Search Report for PCT/US2011/044703 dated Jan. 20, 2012.

*Primary Examiner* — Nikita Wells
(74) *Attorney, Agent, or Firm* — Heslin Rothenberg Farley & Mesiti P.C.

(57) ABSTRACT

A multiple-deflection blanker for charged particle beam lithography includes a support structure, a first pair of electrodes mounted to the support structure and providing a first electric field, a second pair of electrodes mounted to the support structure and providing a second electric field, at least a third pair of electrodes mounted to the support structure and providing a third electric field, and a surface, such as, an aperture or knife edge, positioned to obstruct a charged particle beam passed through the electric fields. The blanker may include at least a fourth pair of electrodes providing a fourth electric field and apparatus for regulating the time of the excitation of the electric fields. Methods for exposing media to charged particles and aperture holders are also provided.

17 Claims, 16 Drawing Sheets

(56) References Cited

U.S. PATENT DOCUMENTS

| | | | |
|---|---|---|---|
| 8,569,712 B2 * | 10/2013 | Knippels et al. | 250/396 R |
| 2007/0064213 A1 | 3/2007 | Jager et al. | |
| 2008/0230711 A1 | 9/2008 | Platzgummer et al. | |
| 2009/0200495 A1 | 8/2009 | Platzgummer | |
| 2009/0206272 A1 | 8/2009 | Parker | |

* cited by examiner

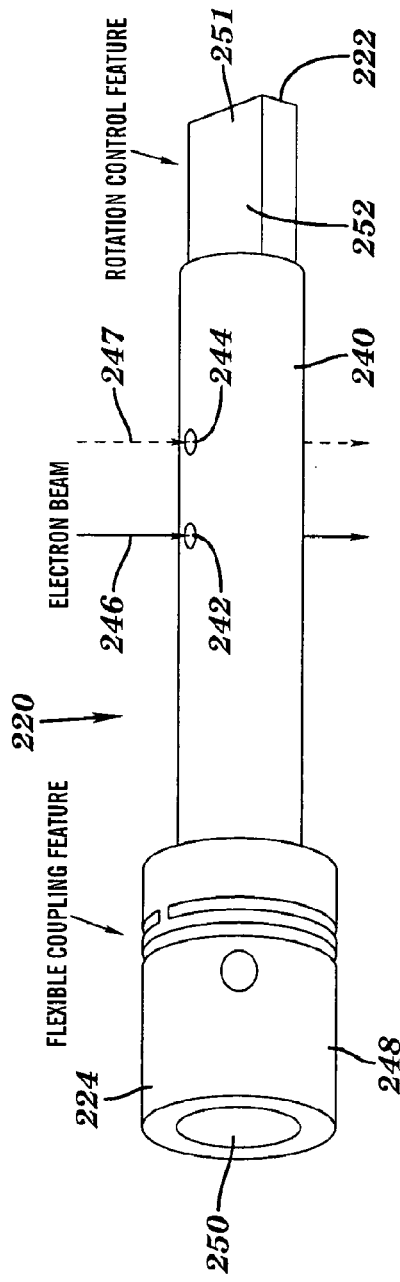
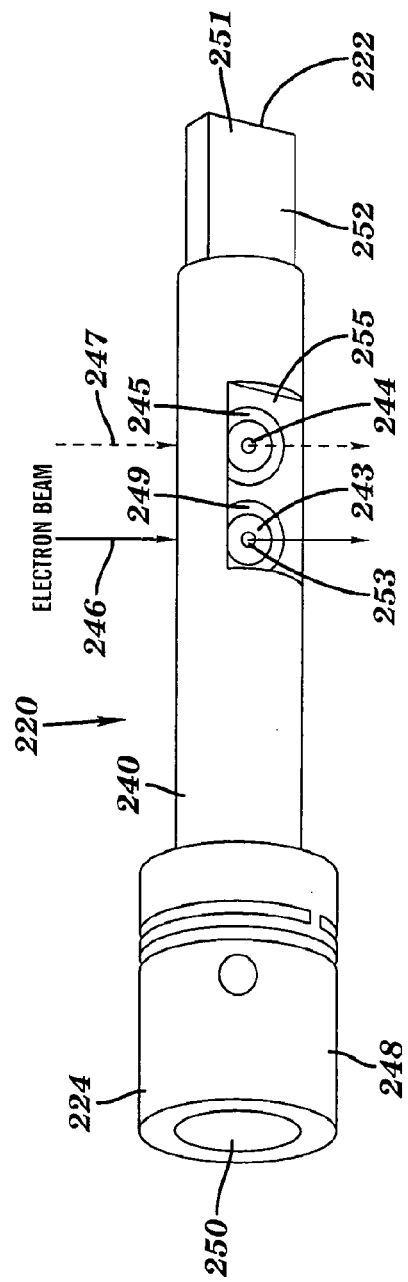

METHODS, DEVICES, AND SYSTEMS FOR MANIPULATING CHARGED PARTICLE STREAMS

CROSS REFERENCE TO RELATED APPLICATIONS

This application is a national stage filing under section 271 of international application no. PCT/US2011/044703 filed on Jul. 20, 2011 and published in English on Jan. 26, 2012 as WO 2012/012548 A2, and claims priority from U.S. Provisional Patent Application 61/366,064, filed on Jul. 20, 2010, the entire disclosure of these applications being hereby incorporated by reference herein.

STATE FUNDED RESEARCH

The invention described herein was made with New York State support under Contract Number C000098 awarded by the New York State Foundation for Science, Technology, and Innovation (NYSTAR) under the Technology Transfer Incentive Program (TTIP). The State of New York has certain rights to this invention.

BACKGROUND OF THE INVENTION

1. Field of the Invention

The present invention relates, generally, to methods and apparatus for manipulating charged particles, for example, electrons or ions, particularly, for controlling the flow of charged particles, for example, for blanking, in lithographic fabrication methods.

2. Description of Related Art

Electron Beam Lithography (EBL) is one of the most important and most widely used methods for nano-fabrication. The primary advantage of electron beam lithography is its high resolution, and its ability to expose nanometer features without a mask. EBL is also the preferred technique for mask manufacturing supporting the integrated circuit industry. On the other hand, one of the key limitations of electron beam lithography is throughput, that is, it takes a relatively long time to expose dense patterns. Slow blanking speed is one of the major bottlenecks for the system speed.

EBL is used principally in three applications in the semiconductor industry. The first is in mask making, typically the chrome-on-glass masks used by optical lithography tools are fabricated by EBL. The second application is direct write for advanced prototyping of integrated circuits and manufacture of small volume specialty products. Finally, EBL is used for research into the scaling limits of integrated circuits and studies of quantum effects and other novel physical phenomena at very small dimensions. Aspects of the present invention may be employed in any one or all of these applications.

An electron beam lithography system is usually a complicated system consisting of numerous software and hardware components. The hardware components include the electron beam column, high voltage power supply, high vacuum system, stage, and electronic control system. The software components include the pattern design, storage and generation software, and proximity effect correction software. The part of electron beam lithography system that forms the electron beam and performs lithography is often referred to as "the column." A column typically consists of an electron source, two or more lenses, a mechanism for deflecting the beam, a "blanker" for turning the beam on and off, a "stigmator" for correcting any astigmatism in the beam, apertures for helping to define the beam, an alignment systems for centering the beam in the column, and finally, an electron detector for assisting with focusing and locating marks on the sample.

The blanker and deflectors are typically the critical components in electron lithography system, and they are essential to provide the "maskless" patterning ability that characterizes EBL.

In the conventional art, blanking, or turning the electron or charged particle beam on and off, is usually accomplished with an electric field between a single pair of parallel plates set up as a simple electrostatic deflector. Blanking voltages on the plates are provided from electronic drivers to the deflector plates. When the beam is in use, the blanking voltage is static at substantially zero volts, and the beam is typically uninterrupted. When the beam is not needed, static "blanking voltages" are applied on the deflector plates. The charged particles, for example, electrons, in the beam are deflected off beam axis by the electrostatic field between the deflector plates. Typically, the beams can be blocked by an aperture edge or "knife-edge" that is designed to stop the beam. Double-deflection blanking is an improvement of the basic single parallel plate pair design. Similar to the single-deflection blanker, an electrostatic field is used to deflect the beam to a beam stop using two sets of plate electrodes.

One of the key limitations of EBL is its relatively low throughput. Compared to optical lithography, the throughput of EBL could be one or more magnitude lower. There are several factors contributing to the total time needed for a lithography job, including exposure time (determined by the area needed for exposure, resist sensitivity, and beam current) shape-to-shape overhead (including the settling time for blanker and deflectors) stage movement overhead (determined by the mechanical design of the stage, the weight of stage and wafer, etc.) wafer-to-wafer overhead (including the pumping time and preparation time for wafers). The exposure time is the most essential part of the EBL operation. However, various overheads can also be significant in some cases.

Improved blanker design can have a positive impact on system throughput. First, an improved blanker design can reduce blanker settling time, which is a direct contribution to shape-to-shape overhead; and, second, an improved blanker can provide support for the fast scanning speed enabled by sensitive resist or high beam current.

Aspects of the present invention provide improved blankers, methods, devices, and systems for blanking, especially, blanking in photolithographic applications. Moreover, it is recognized that aspects of the present invention are not limited to use with EBL or lithography, but may be applied to any application where the manipulation of charged particles is advantageous.

BRIEF DESCRIPTION OF THE FIGURES

The subject matter that is regarded as the invention is particularly pointed out and distinctly claimed in the claims at the conclusion of the specification. The foregoing and other features and advantages of the invention will be readily understood from the following detailed description of aspects of the invention taken in conjunction with the accompanying drawings in which:

FIG. 21 is a top perspective view of the aperture holder shown in FIGS. 17-20 according to one aspect of the invention.

FIG. 22 is a bottom perspective view of the aperture holder shown in FIGS. 17-20.

DETAILED DESCRIPTION OF ASPECTS OF THE INVENTION

Figure 1:
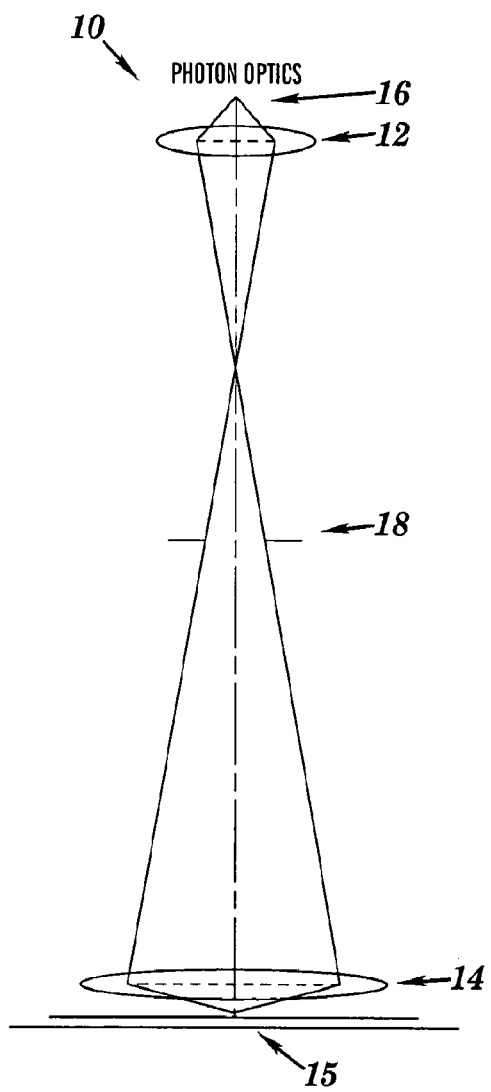
FIG. 1 is a schematic diagram of photon optics.
Figure 2:
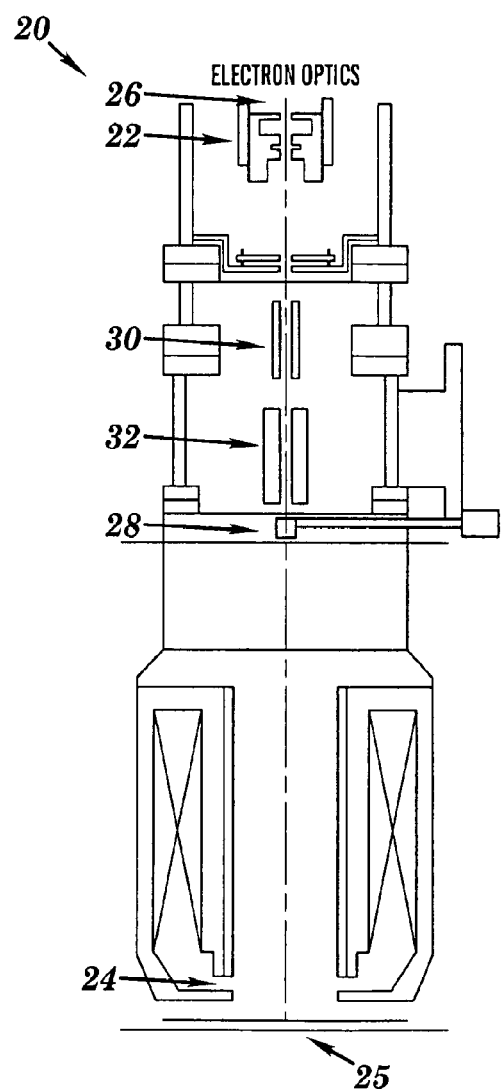
FIG. 2 is a schematic diagram of electron beam optics according to aspects of the invention.

Charged particle manipulation is similar in principle to the handling of photons in light optics. For example, to facilitate illustration of aspects of the invention, a comparison of photon optics to charge particle or electron beam manipulation is shown in FIGS. 1 and 2. FIG. 1 is a schematic ray tracing 10 of photons in a light-based lithograph column. FIG. 2 is a schematic example of electron beam lithography (EBL) column 20. As is known in the art of EBL, electrostatic and magnetic "lenses" 22, 24 are used to manipulate electrons in electron beam optics. These lenses 22, 24 affect the direction of electron beams in a manner similar to the effect of optical lenses 12, 14 on light beams to direct the beams upon a medium 15, 25, respectively, for example, upon a photoresist positioned on a silicon substrate. Both light optic systems 10 and electron beam optic systems 20 require an illumination source 16, 26, respectively, and apertures 18, 28, respectably. Components in electron beam lithography column 20 can be understood using the same optical principle for their photon optic counterparts 10.

Where optical lithography, for example, deep ultraviolet (DUV) and extreme ultraviolet (EUV) lithography, typically employ masks to limit the exposure of the medium 15, for example, a photoresist, as desired to the desired pattern, EBL employs devices known as "blankers" 30 and "deflectors" 32 positioned in column 20 to control the direction of electron beam and provide the "maskless" patterning of medium 25 that characterizes EBL. The blanker 30 effectively turns the electron beam "on" and "off" while the deflector 32 moves the beam to the desired location to be illuminated by the beam when, for example, the beam is turned on by the blanker 30.

Figure 4:
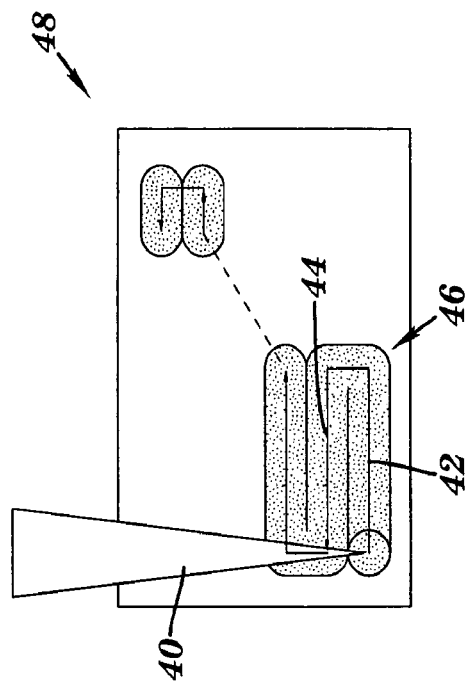
FIG. 4 is a schematic diagram of a vector scanning process according to the prior art.
Figure 3:
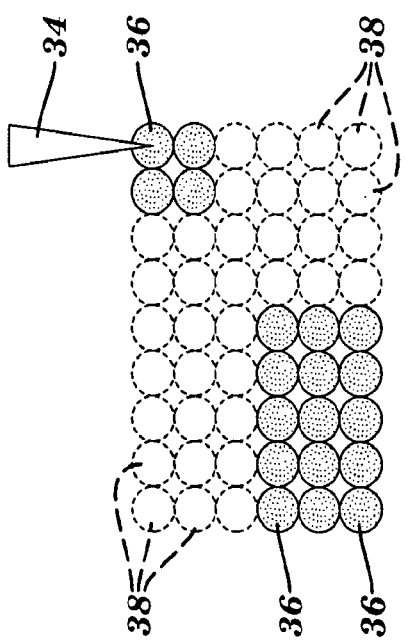
FIG. 3 is a schematic diagram of a raster scanning process according to the prior art.

As known in the art, there are typically two methods, or "writing strategies," for patterning media with electron beams: one method is referred to as "raster-scanning" and the other "vector-scanning" In raster scanning, for example, as disclosed by Murray, et al. (1993), the disclosure of which is incorporated by reference herein, and shown in FIG. 3, the electron beam 34 is scanned back and forth over the desired area to be exposed and the electron beam is turned on when the beam is positioned over a desired location or pattern feature. In FIG. 3, the beam 34 illuminates areas, for example, pixels, 36 and the beam is turned off in pixels 36. In vector scanning, for example, as disclosed by Speth, et al. (November 1975), the disclosure of which is incorporated by reference herein, and shown in FIG. 4, the electron beam 40 is continuously scanned to create a pattern of adjacent lines within a shape, and then the beam is blanked and moved to the beginning of another shape, where scanning may continue. In FIG. 4, the beam 40 scans adjacent lines 42 and 44 in one area 46 before terminating illumination and moving the beam 40 to another area 48 to continue illumination with beam 40. With a vector scanning writing strategy, the electron beam does not direct the beam to an area where patterning is not needed. Hence, a vector scan writing strategy can be advantageous for enhancing throughput, especially for isolated patterns on a medium.

Figure 5:
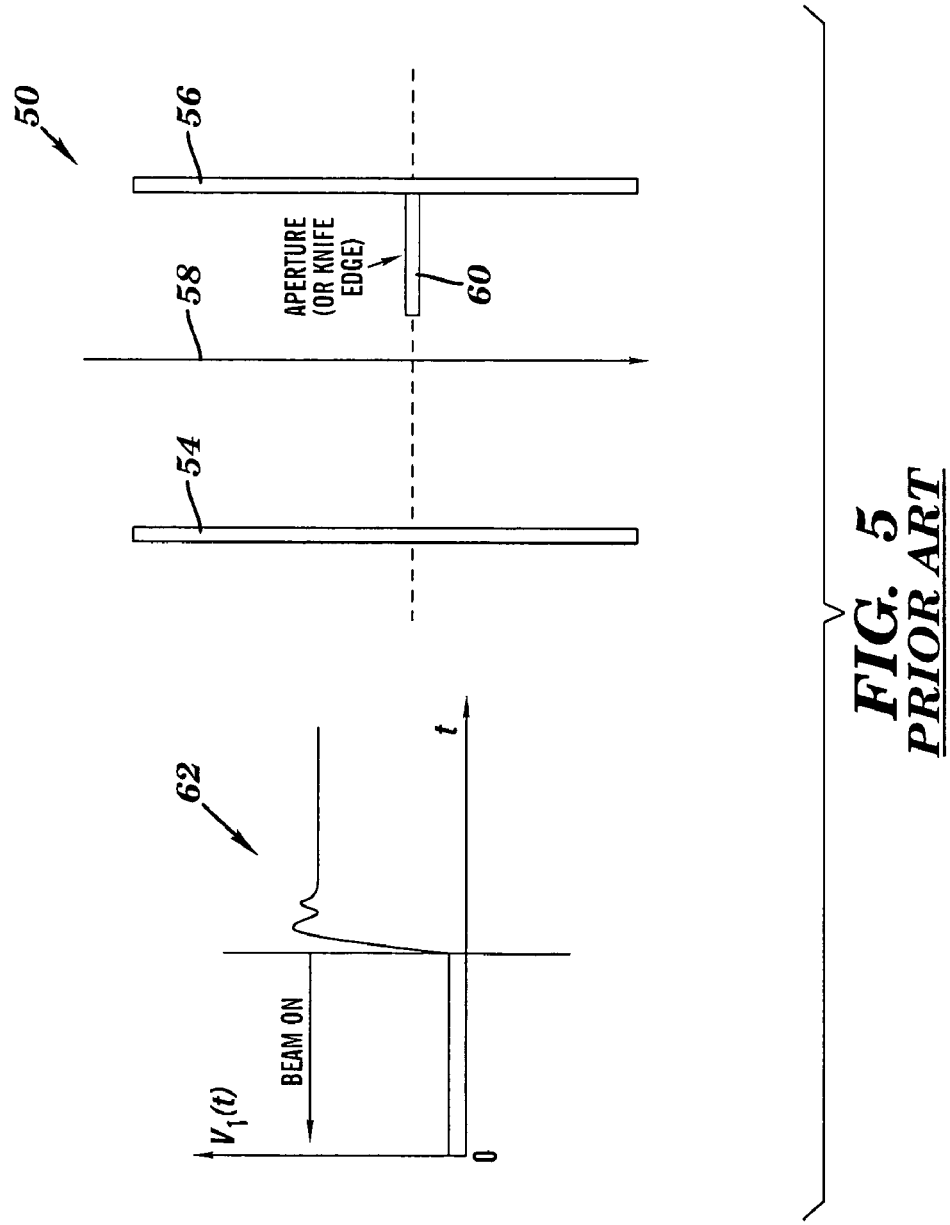
FIGS. 5 and 6 are schematic diagrams of a conventional EBL blanker according to the prior art in the "on" and in the "off" mode, respectively.
Figure 6:
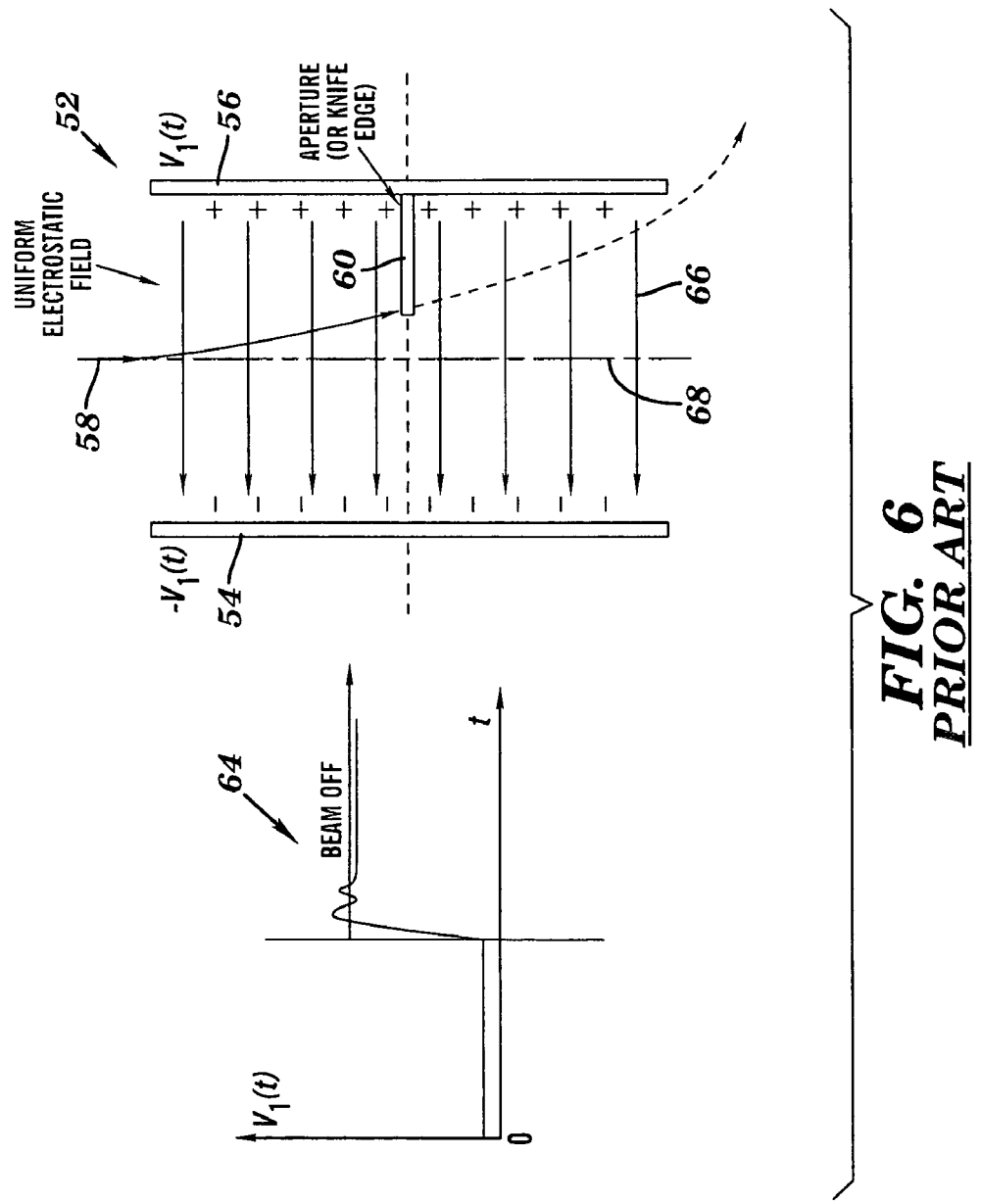

According to the conventional art, "blanking," or turning the beam on and off, is usually accomplished with a pair of parallel plates arranged as a simple electrostatic deflector. FIGS. 5 and 6 are schematic diagrams 50 and 52, respectively, of a conventional EBL blanker. FIGS. 5 and 6 includes a set of plate electrodes, or "deflector plates," 54 and 56 spaced about a path of electron beam 58 and an obstruction 60, or "knife edge," positioned to block beam 58 when beam 58 is deflected by an electric field generated between plates 54 and 56. FIGS. 5 and 6 also include a representative curves 62 and 64, respectively, of voltage, V, as a function of time, t, across plate electrodes 54 and 56 when the beam 58 is "on," as in FIG. 5, and "off," as in FIG. 6.

Typically, the voltage V, or the "blanking voltage" is provided from electronic drivers electrically coupled to plates 54 and 56. When the blanker beam 58 is being directed on a medium (not shown) as shown in FIG. 5, that is, is turned "on," the blanking voltage is typically static at zero, as shown by curve 62 in FIG. 5. When the blanking beam 58 is not needed, that is, is turned "off," as shown in FIG. 6, a static blanking voltage V is applied to plates 54 and 56 creating an electric field represented by arrow 66. In the presence of electric field 66, electrons in electron beam 58 are deflected off the beam axis 68 by the electrostatic field 66 between the deflector plates 54 and 56, and as desired, blocked by the obstruction 60, for example, an edge of aperture or a knife-edge or a "beam stop," that is designed and positioned to obstruct beam 58. Obstruction 60 may typically comprise a surface, for example, a conductive surface, such as, a metallic surface, positioned to block electrons in beam 58. However, according to aspects of the invention, obstruction 60 may comprise a structure that is thick enough to stop the charged particle in beam 58, for example, an electron. Obstruction 60 may be non-metallic, for example, ceramic or carbon, and provide the desired particle stopping function. Accordingly, the electron beam 58 does not pass through blanker 2 and does not impinge the medium (not shown) being treated.

Figure 7:
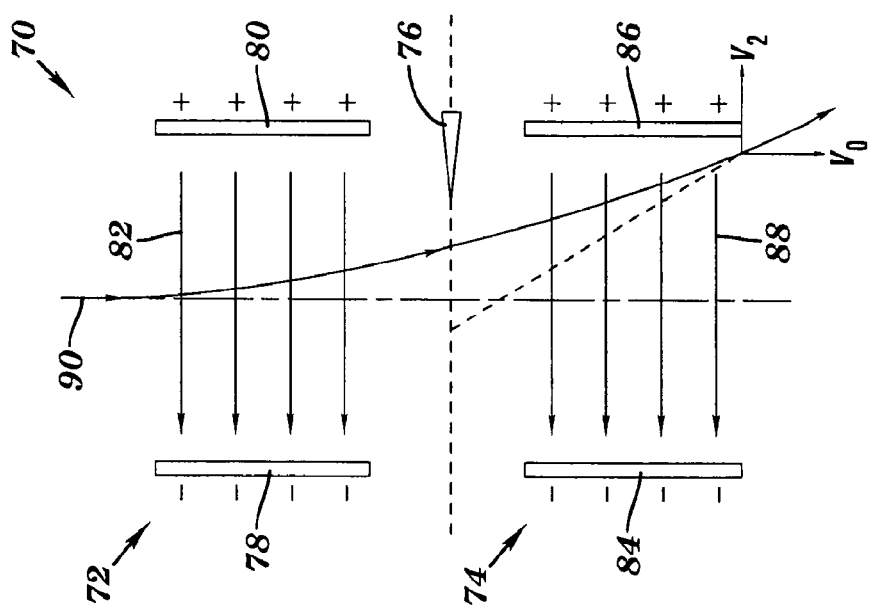
FIG. 7 is a schematic diagram of a "double-deflection" EBL blanker according to the prior art.

A "double-deflection" EBL blanker according to the prior art is shown in FIG. 7. Similar to the single-deflection blanker shown in FIGS. 5 and 6, blanker 70 deflects a beam of electrons 90 with electrostatic fields upon an obstruction 76. However, double-deflection blanker 70 employs two sets of plate electrodes 72 and 74 having an obstruction or beam stop 76 positioned between them. The first set 72 of electrodes includes plate electrodes 78 and 80 between which an electric field, indicated by arrows 82, is provided, and the second set 74 of electrodes includes plate electrodes 84 and 86 between which an electric field, indicated by arrows 88, is provided to direct a electron beam 90 onto obstruction 76 as desired.

Figure 8:
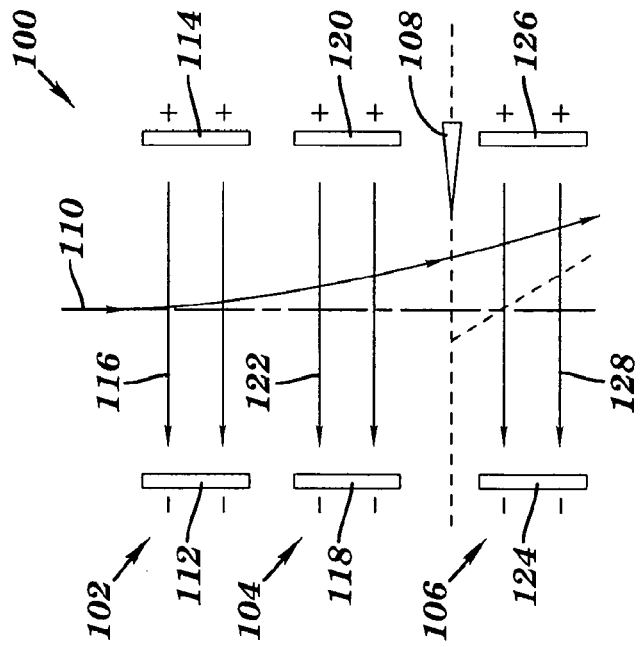
FIG. 8 is a schematic diagram of one blanker assembly according to one aspect of the invention.

Based on the thorough studies on single—(as shown in FIGS. 5 and 6) and double-deflection (as shown in FIG. 7) blankers, an innovative architecture for high speed blanking is proposed. In contrast to the prior art shown in FIGS. 5-7, one aspect of the present invention is shown in FIG. 8. For example, in one aspect, at least three sets of deflector plates are provided, and typically at least four sets of deflector plates are provided, and the electric fields between the plates are regulated or controlled to provide more effective blanking.

FIG. 8 is a schematic diagram of one blanker assembly 100, for example, a multiple-deflection blanker for charged particle beam lithography, according to one aspect of the invention. As shown in FIG. 8, blanker assembly 100 includes a first pair of electrodes 102 amounted to a support structure (not shown, but shown, for example, in FIGS. 17-20 below), a second pair of electrodes 104 mounted to the support structure and electrically isolated from the first pair of electrodes 102, at least a third pair of electrodes 106 mounted to the support structure and electrically isolated from the second pair of electrodes 104, and electrically isolated from the first pair of electrodes 102, and a surface 108, for example, a beam stop, an aperture, or a knife edge, positioned to obstruct a charge particle beam 110, for example, a beam of electrons or charged particles, that is passed through assembly 100. The first pair of electrodes 102 includes electrodes 112 and 114 that are spaced from each other and adapted to provide a first electric field, indicated by arrows 116, between electrodes 112 and 114. The second pair of electrodes 104 includes electrodes 118 and 120 that are spaced from each other and adapted to provide a second electric field, indicated by arrows 122, between the electrodes 118 and 120. The third pair of electrodes 106 includes plate electrodes 124 and 126 that are spaced from each other and adapted to provide a third electric field, indicated by arrows 128 between the electrodes 124 and 126. Electrodes 112, 114, 118, 120, 124, and 126 may typically comprise parallel plate electrodes, though other electrode shapes and orientations are envisioned.

According to aspects of the invention, the electric fields 116, 122 and 128 are regulated to control the trajectory of charged particle beam 110 to allow beam 110 to pass through assembly 100 and impinge the desired medium being treated (not shown), for example, a photoresist, and to vary the path of the beam 110 so that it is blocked by obstruction 108 as desired, for example, to turn beam 110 "off." According to aspects of the invention, the beam 110 passes through at least one of the electric fields 116, 122, and 128, but typically passes throughout all three fields.

Thought not shown in FIG. 8, the blanker assembly or blanker 100 typically is operatively connected to a source of electric power, for example, a source of direct current (DC) electric power, to provide the electric fields 116, 122 and 128 between the electrodes. In addition, the blanker 100 may include means for regulating (not shown) the power provided to the electrodes 112, 114, 118, 120, 124 and 128. The means for regulating may include means for regulating the timing, the amplitude, or both of the electric power provided. For example, the means for regulating the timing of the electric power may comprise means for regulating the timing wherein at least one time delay in the excitation of the pairs of electrodes 102, 104, or 106 of blanker 100 may be provided.

In one aspect of the invention, the surface 108, for example, the stop, knife edge, or apertures, may be positioned between any two sets of electrodes 102, 104, and 106. However in one aspect, the surface 108 may be positioned between the second pair of electrodes 104 and the third pair of electrodes 106. That is, the surface 108 may be positioned to obstruct a charged particle beam 110 deflected by the second electric field 122 of the second pair of electrodes 104.

Figure 10:
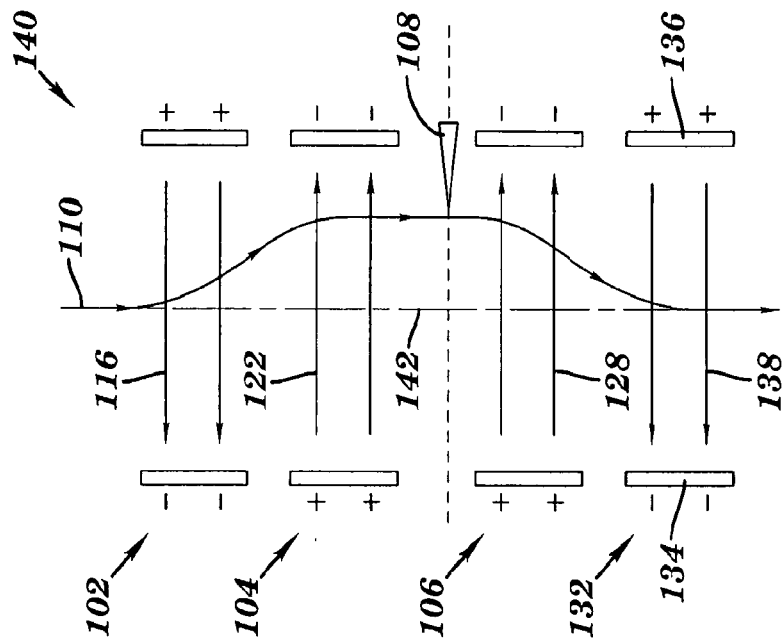
FIG. 10 is a schematic diagram of a four-electrode blanker operating in another mode according to an aspect of the invention.
Figure 9:
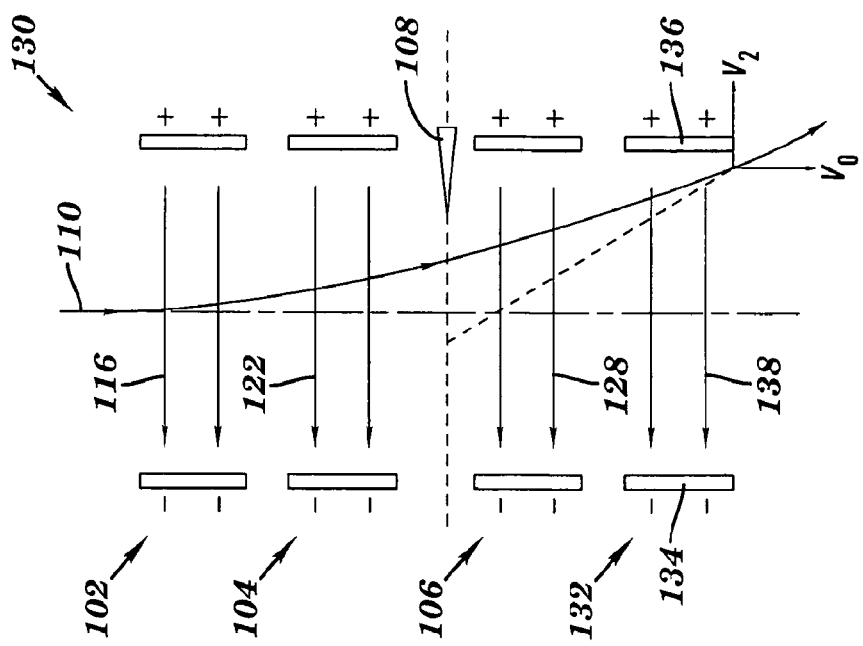
FIG. 9 is a schematic diagram of a four-electrode blanker operating in one mode according to an aspect of the invention.

As described with respect to FIG. 8, in one aspect, at least three pairs of electrodes 102, 104, and 106 may be provided. In one aspect of the invention, at least four pairs of electrodes are provided, for example, exactly four pairs of electrodes are provided. This aspect of the invention is shown in FIGS. 9 and 10. FIG. 9 is a schematic diagram of a four-electrode blanker 130 operating in one mode according to an aspect of the invention;

FIG. 10 is a is a schematic diagram of a four-electrode blanker 140 operating in another mode according to an aspect of the invention. Similar to the three-electrode embodiment 100 shown in FIG. 8, the blankers 130 and 140 shown in FIGS. 9 and 10 include electrode pairs 102, 103, and 106, a surface 108, and also includes a fourth electrode pair 132. Similar to electrode pairs 102, 103, and 106 shown n FIG. 8, fourth electrode pair 132 is mounted to a support (not shown) and include electrodes 134 and 136 that are spaced from each other and adapted to provide a first electric field, indicated by arrows 138, between electrodes 134 and 136.

Blanker 130 shown in FIG. 9 is illustrated as operating in "a conventional excitation" mode. That is, according to this aspect of the invention, blanker 130 the four electric fields represented by arrows 116, 122, 122, and 138 are directed in the relatively same direction, for example, horizontally to the left as shown in FIG. 9. Blanker 130 may be configured to operate in a manner similar to prior art blankers, that is, by controlling the timing of the excitation of the pairs of electrodes. For example, blanker 130 may typically be operated with a time delay between the excitation of electrode pairs 102, 104, 106, and 132 to emulate a substantially steady-state environment for electrons passing through electrode pairs 102, 104, 106, and 132 during the excitation of the electrode pairs, in particular, during the "transition" between substantially steady-state "on" operation and substantially steady-state "off" operation.

Blanker 140 shown in FIG. 10 is illustrated as operating in "a collimated excitation" mode. A collimated mode of execution provides further advantages over the conventional mode shown in FIG. 9. As shown in FIG. 10, in collimated mode, blanking electric fields 116, 122, 128, and 138 between electrode pairs 102, 104, 106, and 132, respectively, are not directed in the same direction, as in FIG. 9, but alternate in direction. For example, as shown in FIG. 10, electric field 116 is directed toward the left in the figure, electric filed 122 is directed in an opposite direction toward the right in the figure, electric field 128 is also directed toward the right, while electric field 138 is directed toward the left. Accordingly, the electric fields in blanker 140 may provide an alternating direction of acceleration for electrons in beam 110. According to aspects of the invention, when the voltages of the electric fields are properly delayed, the electrons in beam 110 can be directed to follow a collimated path between the extremities defined by the surface of the electrodes, for example, down the middle of blanker 140, for example, substantially along the center like or optical axis 142, or, with appropriate timing and direction of the electric fields, anywhere between the electrodes and the centerline or optical axis 142. For example, in one aspect, the beam of charged particles 110 may be directed along the centerline 142 and on to projection lens (not shown) as if the beam 110 is not affected by blanker 140. The mode of operation illustrated in FIG. 10 may also be referred to as "telecentric" mode according to aspects of the invention.

Some aspects of the invention exhibit what is called "telecentricity." According to these aspects of the invention, telecentricity is a term that characterizes the relative orientation of the beam relative to the beam axis, for example, near the aperture or knife edge. For example, a beam that is more parallel or more coincident with the beam axis (or the initial beam direction) is characterized as having greater or more telecentricity compared to a beam that deviates from the beam axis. Aspects of the present invention that exhibit telecentricity are less prone to create errors in the target design or pattern. In one aspect, the telecentric character of the beam may be referred to as being "collimated." In one aspect of the invention, the charged particle beam exhibits telecentricity whereby the path of the beam is substantially collinear with or parallel to the beam axis, for example, in the middle of the blanker. In some aspects of the invention, the path of the charged particle beam exhibits telecentricity whereby the path of the beam is collinear with or parallel with the beam axis after passing through the blanker. In some aspects, of the invention, a blanker may be provided with multiple deflectors, for example, 5 or more, 6 or more, pairs of electrode deflectors, which can provide enhanced telecentricity of the resulting beam. This beam with enhanced telecentricity may be characterized by providing few or substantially no errors or deviations in the accuracy of the desired pattern produced on the medium being treated, for example, a photoresist. In some aspects of the invention enhanced telecentricity can be provided with as few as 2, 3, or 4 spaced individual electric fields.

According to aspects of the invention, the three-electrode pair blanker 100 shown in FIG. 8 may also be operated in conventional excitation mode and in collimated (or telecentric) excitation.

According to aspects of the invention, the inventors have found that the collimated mode of operation of blanker 100, 130, and 140 represented by blanker 140 shown in FIG. 10 provides superior performance compared to prior art blanker designs. Specifically, the inventors have found that the advantages of collimated mode of aspects of the present invention include:

Conjugate blanking errors can be reduced or eliminated. For example, by applying aspects of the invention, there may be no need to locate the blanker on the conjugate image point of the projection lens. Unlike in single-, double-, or conventional mode, aspects of the present invention, the electrons may leave the blanker along the optical axis 142.

Beam motion error due to blanking may be reduced or eliminated when the voltage excitation of aspects of the present invention are properly time delayed. For example, unlike prior art blanker designs, beam motion error for collimated mode of aspects of the invention may approach zero, even when the excitation voltage signal is transient over time.

Excitation Time Delay Considerations

According to some aspects of the invention, the timing of the activation of the eclectic fields, for example, between spaced electrodes, may be controlled in order to account for the transient nature of the electric filed upon activation and termination, for example, the ramping up or ramping down of the electric field. Due to these electrical "transient" effects, in one aspect, the activation and/or termination of the electric field may be temporally staggered or time delayed to minimize or eliminate the effect of transient voltages and/or currents on the electric fields. For example, the time delays may be a function of particle speed and dimensions of the systems and apparatus, for instance the height or length of the electrodes in the direction of motion of the particles. In one aspect, mathematical processors, for example, a computer, a data acquisition system, or a programmable logic controller (PLC) may be used to input, calculate, and/or output appropriate time delays for activation and/or termination of electric fields. In other aspects of the invention, the desired time delays may be provided by an electronic signal generator, for example, an electronic signal generator having a processor or a computer configured to receive, calculate, output, and/or control time delays for one or more of the electric fields. Other means of providing time delays according to aspects of the invention include by mean of the physical structure of the device and the inherent delay in electrons passing from one part of the structure to another part of the structure, for example, as characterized by the "horse shoe" structures disclosed in U.S. Pat. No. 4,445,041 of Kelly, et al. or U.S. Pat. No. 6,521,896 (the disclosures of which are incorporated by reference herein in their entirety). Other means of providing a time delay for aspects of the invention include: 1) using carefully cut coaxial cables; and 2) electronically with delay control and line driver (amplifier) for every channel.

Figure 11:
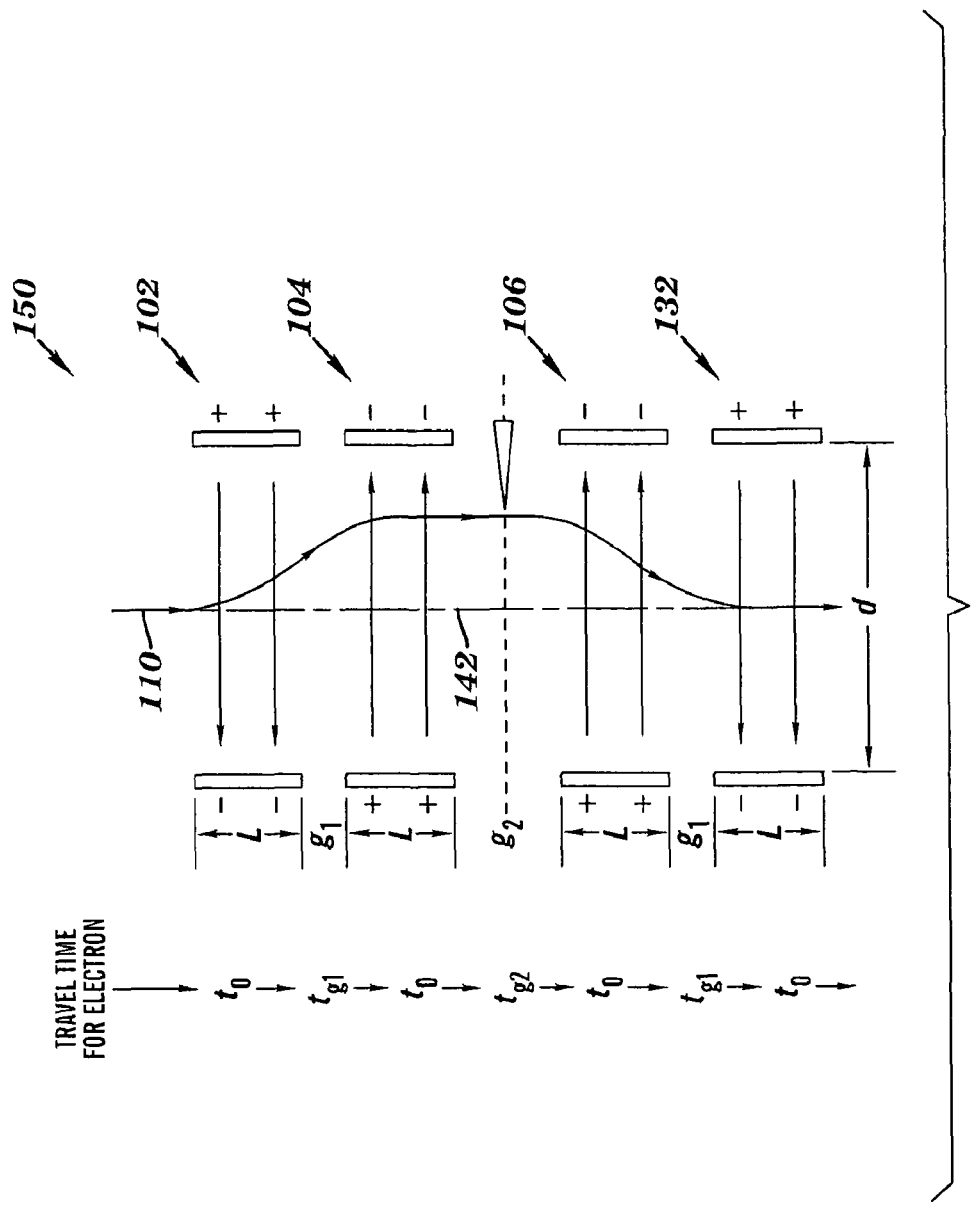
FIG. 11 is a schematic diagram of a blanker illustrating excitation time delay design parameters and travel time for a beam of electrons or charged particles according to aspects of the present invention.

FIG. 11 is a schematic diagram of a blanker 150 illustrating excitation time delay design parameters and travel time for a beam of electrons or charged particles 110 according to an aspect of the present invention. As shown, this aspect of the invention includes four electrode pairs 102, 104, 106, and 132, which may be similar to the identically referenced electrode pairs discussed above, though these parameters also apply to blankers having three pairs of electrodes.

As shown in FIG. 11, characteristic dimensions and parameters of aspects of the invention include:

L, the length of electrode in the direction of travel of the electrons in beam 110. In one aspect, L should be identical for all electrode pairs, for example, about 10 millimeters [mm] to about 50 mm, for example, about 25 mm.

d, is the distance between electrodes in an electrode pair, for example, a lateral distance that may range from about 1 mm to about 3 mm.

$g_n$, the gap distance between the two spaced, for example, vertically spaced, pairs of electrodes, for example, $g_1$ is the gap between electrode pair 102 and electrode pair 104, and $g_2$ is gap between electrode pair 104 and electrode pair 106. The gaps $g_n$ may be equal in one aspect, but may vary between electrodes in other aspects. However, in one aspect, $g_1$ may be minimized, for example, to increase blanking deflection range. In one aspect, $g_2$ can be determined by the mechanical design of the blanker or aperture assembly. Typically, $g_n$ may range in length from about 3 mm to about 10 mm, for example, about 6 mm.

In one aspect, the structure or layout of blanker 150 may be symmetric about an axis 142, for example, an optical axis, in another aspect, the structure or layout of blanker 150 may be symmetric about a plane passing though axis 142, for example, a plane substantially perpendicular to the page of FIG. 11 and passing through axis 142. In other aspects, blanker 150 may vary from symmetry about a line or plane. As known in the art, in one aspect, a symmetric structure may be desired to achieve "conjugate blanking." When operated in "collimated mode of excitation," a symmetric structure may be needed to bring the electron beam 110 back to axis 142.

Employing the above parameters, the velocity of an electron, $V_0$, in beam 110 traveling along the beam axis 142 is a function of beam voltage, $V_B$, and can be expressed as, $$v_0 = \sqrt{\frac{2e_0 V_B}{m_0 \chi}} \qquad \text{Equation 1}$$

where $$\chi^{-1} = \frac{(1+\varepsilon V_B)}{(1+2\varepsilon V_B)^2}, \qquad \text{Equation 2}$$

where $$\varepsilon = \frac{e_0}{2m_0 c^2} \qquad \text{Equation 3}$$

and where c is the speed of light; $e_0$ is the charge of the electron; and $m_0$ is the mass of an electron.

Accordingly, the transit time for an electron to travel through one set of plate electrodes is given by $$t_0 = \frac{L}{v_0}. \qquad \text{Equation 4}$$

and the transit time, $t_{gn}$, for an electron to travel through the gaps between two sets of electrodes plates is calculated as $$t_{g1} = \frac{g_1}{v_0}, t_{g2} = \frac{g_2}{v_0} \qquad \text{Equation 5}$$

By using Equations 1 through 5, it can be shown that, for steady state in collimated mode of excitation, electron trajectories can be parallel to the beam axis in gap $g_2$ and after the blanker unit. According to aspects of the invention, an optimal delay time for collimated mode can be determined to achieve the same effect in the transient state between the "on" and "off" conditions and minimize or eliminate the beam motion error due to blanking.

According to aspects of the invention, when taking the transient state between "on" and "off" into account, in order to ensure electron trajectories in the beam 110 are substantially parallel to the beam axis 142 in gap $g_2$, there should be a time delay $t_0+t_{g1}$ between the voltage across electrodes 102 and the voltage across electrodes 104. Similarly, to ensure that the electron trajectories are substantially parallel to the beam axis 142 after the blanker 150, there should be a time delay $t_0+t_{g1}$ between the voltage across electrodes 106 and the voltage across electrodes 132. Additionally, to ensure the electron trajectories are actually on axis 142 after they exit the blanker 150, it is desired that there be a time delay $t_0+t_{g2}$ between the voltage across electrodes 104 and voltage across electrodes 106. According to aspects of the invention, with these optimal delay times, the electrons in beam 110 can behave similarly to a steady state, and the beam motion error is minimized or, desirably, eliminated.

Accordingly, with aspects of the present invention, optimal delay times can be used for multiple electrode blankers, for example, having three or more pairs of electrodes, operated in collimated or conventional mode, and provide electron trajectories in the transient state to mimic the trajectories of electrons in steady state modes. The voltage functions employed on the electrode pairs of blanker 150, according to aspects of the invention, can be expressed as $$V_1(t)=V(t)$$

$$V_2(t)=-V(t-t_0-t_{g1})$$

$$V_3(t)=-V(t-2t_0-t_{g1}-t_{g2})'$$

$$V_4(t)=V(t-3t_0-2t_{g1}-t_{g2}) \qquad \text{Equation 6}$$

where $V_1$ is the voltage applied across electrodes 102; $V_2$ is the voltage applied across electrodes 104; $V_3$ voltage applied across electrodes 106; and $V_4$ is the voltage applied across electrodes 132.

When aspects of the invention are operated in conventional mode, the optimal time delay may be similar to the time delay for a double-deflection blanker. For example, the optimal delay time for conventional mode may be determined by using simulation software to search for a minimal error. The inventors have found that the same estimation rule as double-deflection blanker can be used for conventional mode operation of aspects of the invention. That is, the following equations can be used to estimate optimal delay time for conventional mode operation of aspects of the invention having three or four pairs of electrodes:

$$\text{Time delay}=t_D=t_0+t_g+t_D' \qquad \text{Equation 7}$$

when $$0 \leq t_D' \leq \frac{1}{3}t_0 \qquad \text{Equation 8}$$

$t_D'$ is a small positive number compared to both $t_0$ and $t_g$. $t_D$ is the delay of voltage between two sets of pairs of electrodes. The gap time, $t_g$, can be $t_{g1}$ or $t_{g2}$ depending upon the gap being considered.

Figure 12:
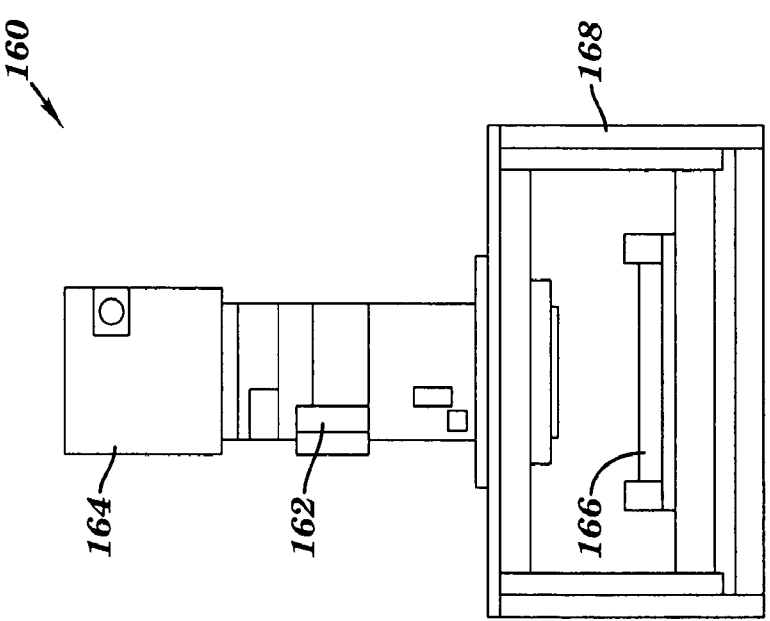
FIG. 12 is a schematic diagram of an EBL column that can be used to employ the methods and apparatus of the present invention.

FIG. 12 is a schematic diagram of an EBL column 160 that can be used to employ the methods, blankers, devices, and apparatus of the present invention. For example, blanker 100, 130, 140, or 150 may be positioned in column 160 as a module or blanker assembly 162 between EB source 164 and the medium to be treated 166 positioned in enclosure 168, for example, under vacuum, typically, approximately $10^{-6}$ torr.

Figure 13:
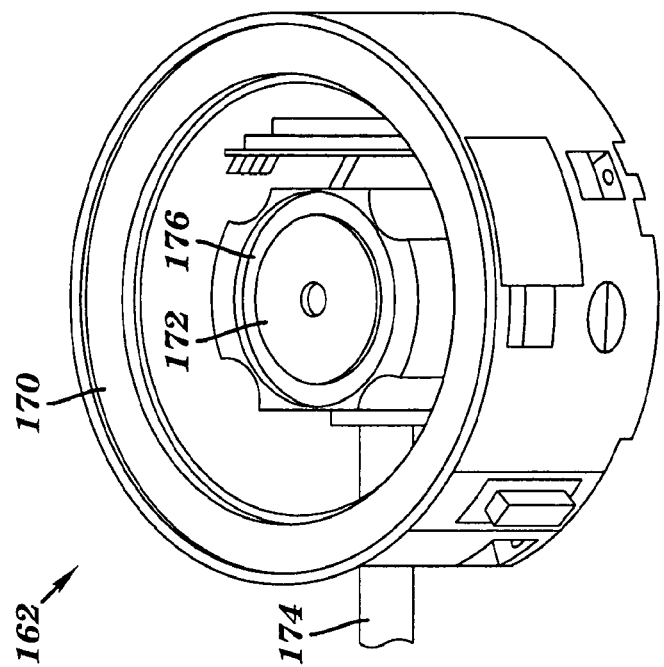
FIG. 13 is a front perspective view of a module or column section according to an aspect of the invention
Figure 14:
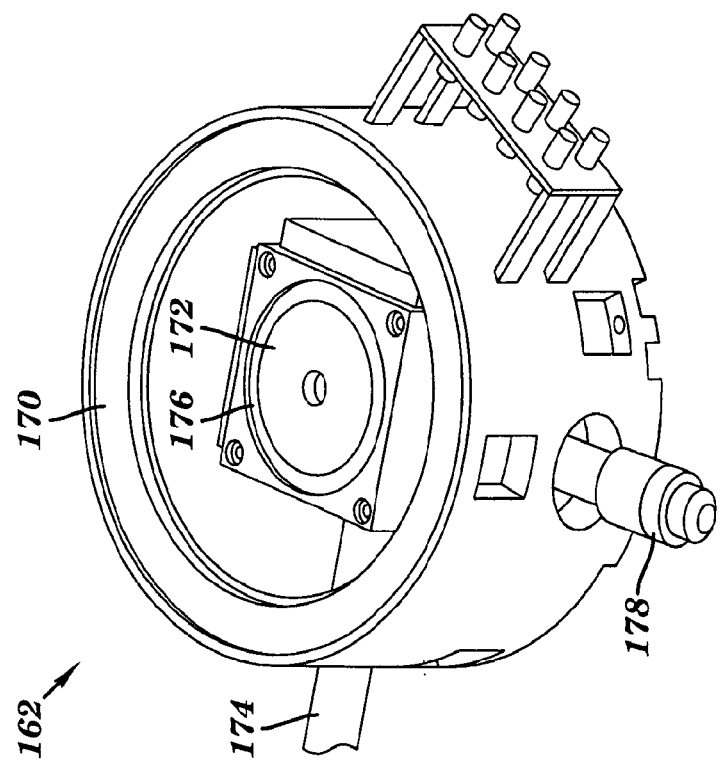
FIG. 14 is a rear perspective view of module or column section shown in FIG. 12 holding a blanker or blanker assembly according to an aspect of the invention.

FIG. 13 is a front perspective view of a module or column section or blanker assembly 162 and FIG. 14 is a rear perspective view of module or column section or blanker assembly 162 shown in FIG. 12 holding a blanker or blanker assembly according to an aspect of the invention. The column section 162 shown in FIGS. 13 and 14 is a column section used in a Vistec VB6 test stand, but aspects of the invention are compatible with any EBL or charged particle column system.

As shown in FIGS. 13 and 14, column section 162 includes a cylindrical outer housing 170 enclosing a vacuum chamber, "vacuum box," or inner housing 172 housing the blanker assembly. As is typical, column section or blanker assembly 162 includes mechanical interfacing adapted to mount column section 162 to adjacent structures in column 160. A vacuum pipe 174 accesses vacuum chamber 172 and the vacuum chamber 172 is typically provided with sealing means, for example, an o-ring groove 176 adapted to receive an elastomeric o-ring (not shown) to seal the vacuum chamber 172 from adjoining parts of column 160. A drive mechanism 178 adapted to manipulate the aperture, as described below, may also be provided. A conduit (not shown) operatively connecting vacuum chamber 172 to an ion pump (not shown) may also be provided.

Figure 15:
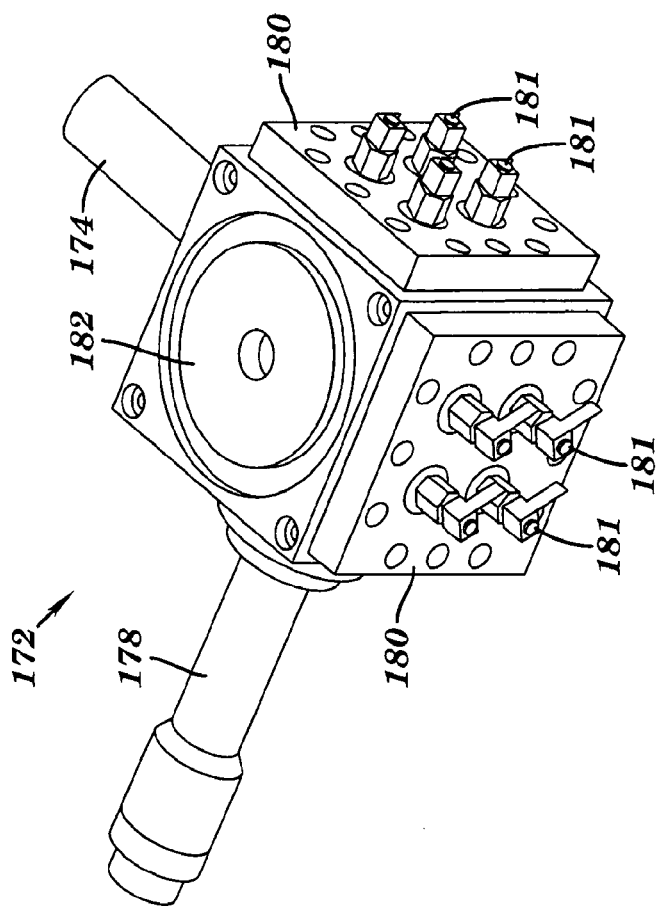
FIGS. 15 and 16 are perspective views of the vacuum chamber shown in FIGS. 13 and 14.
Figure 16:
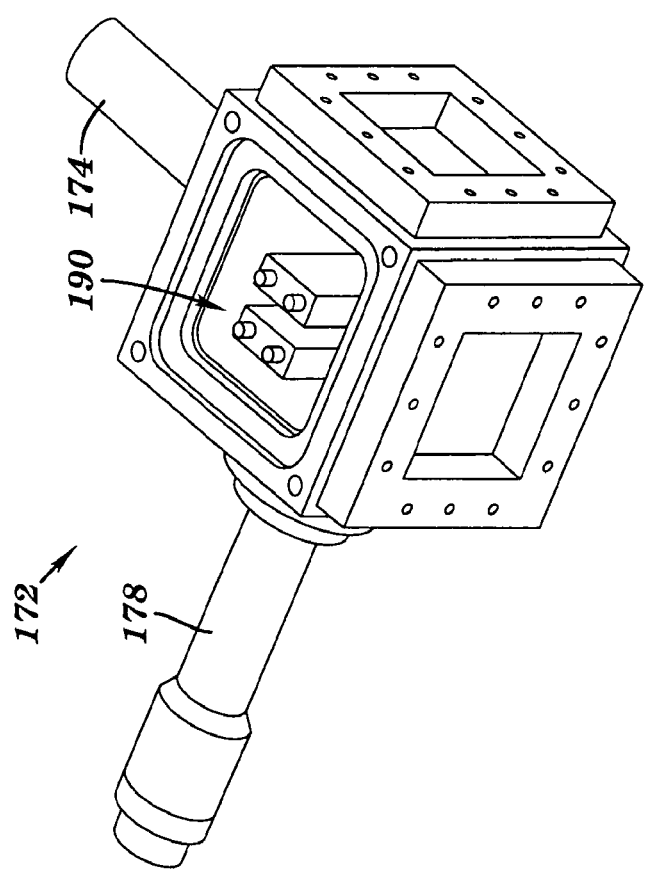

FIGS. 15 and 16 are perspective views of the vacuum chamber 172 shown in FIGS. 13 and 14. In FIG. 16, the side plates, or "vacuum doors," 180 and top plate 182 of vacuum chamber 172 are removed to reveal a blanker assembly 190 according to aspects of the invention positioned inside vacuum chamber 172. The vacuum doors 180 may typically include access ports 181, or "vacuum feed throughs," to allow access to electrical wires/cables any process fluids, if needed.

Figure 17:
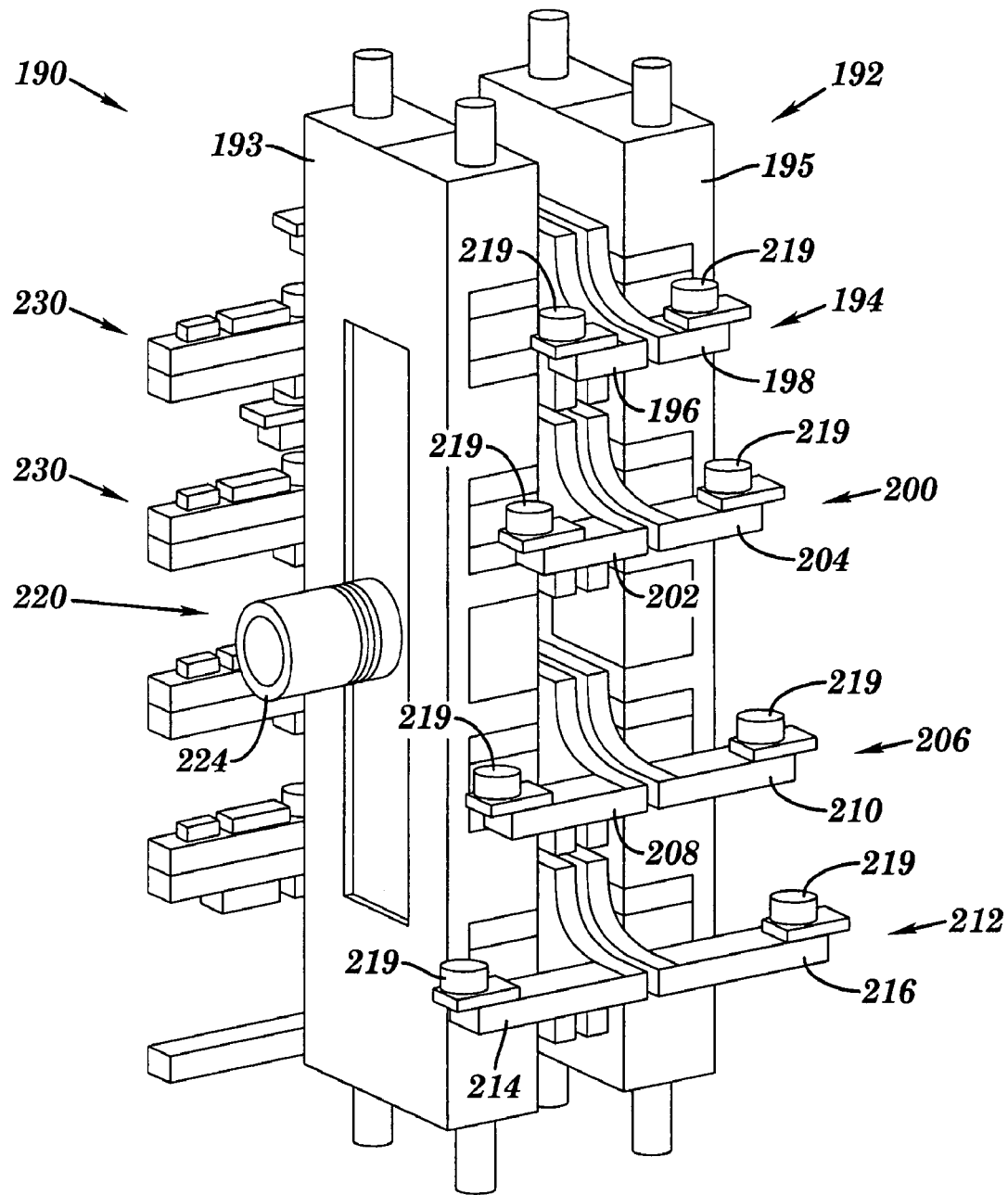
FIG. 17 is a right, front perspective view of the blanker assembly shown in FIG. 16.
Figure 18:
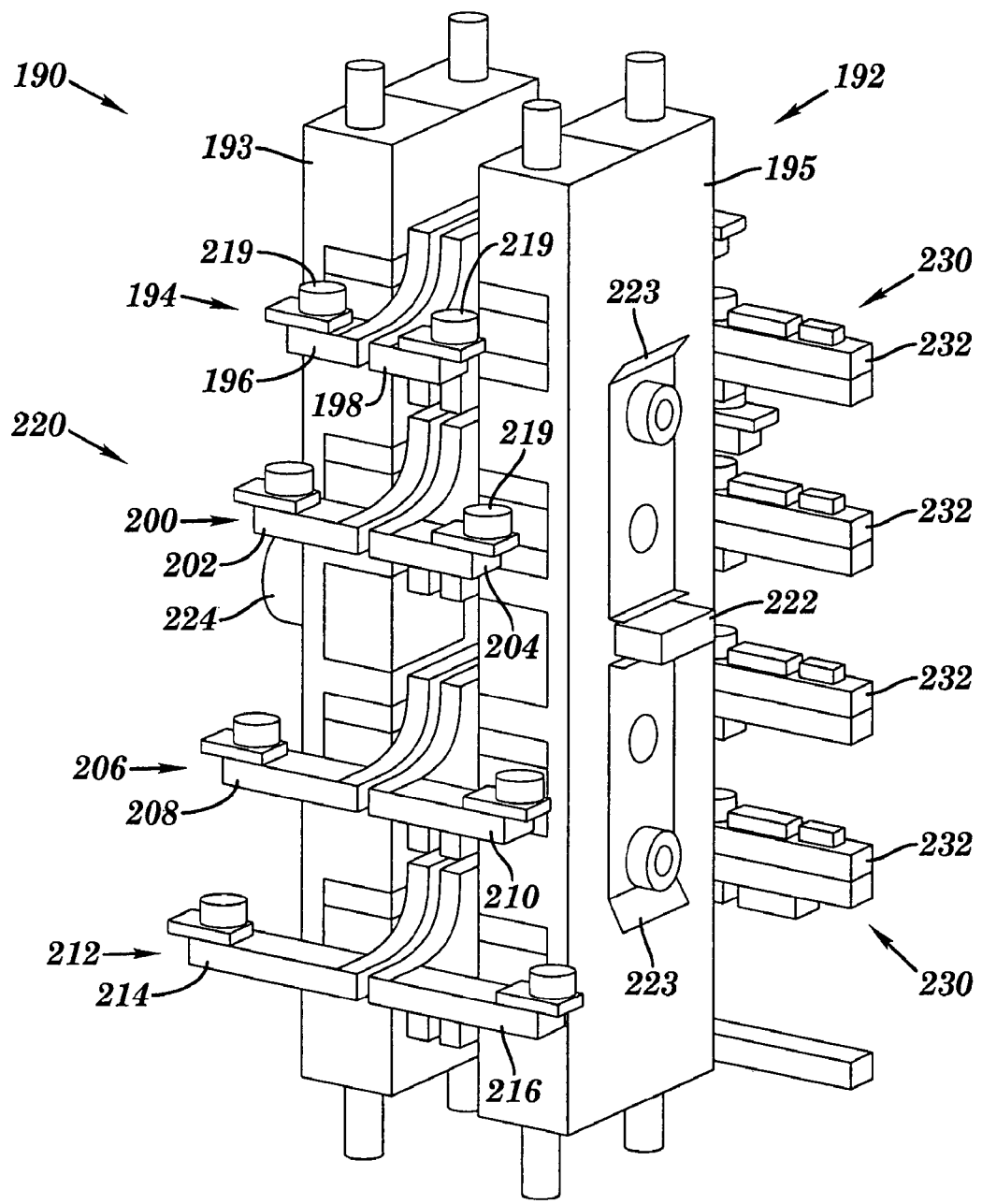
FIG. 18 is a left, front perspective view of the blanker assembly shown in FIG. 16.
Figure 19:
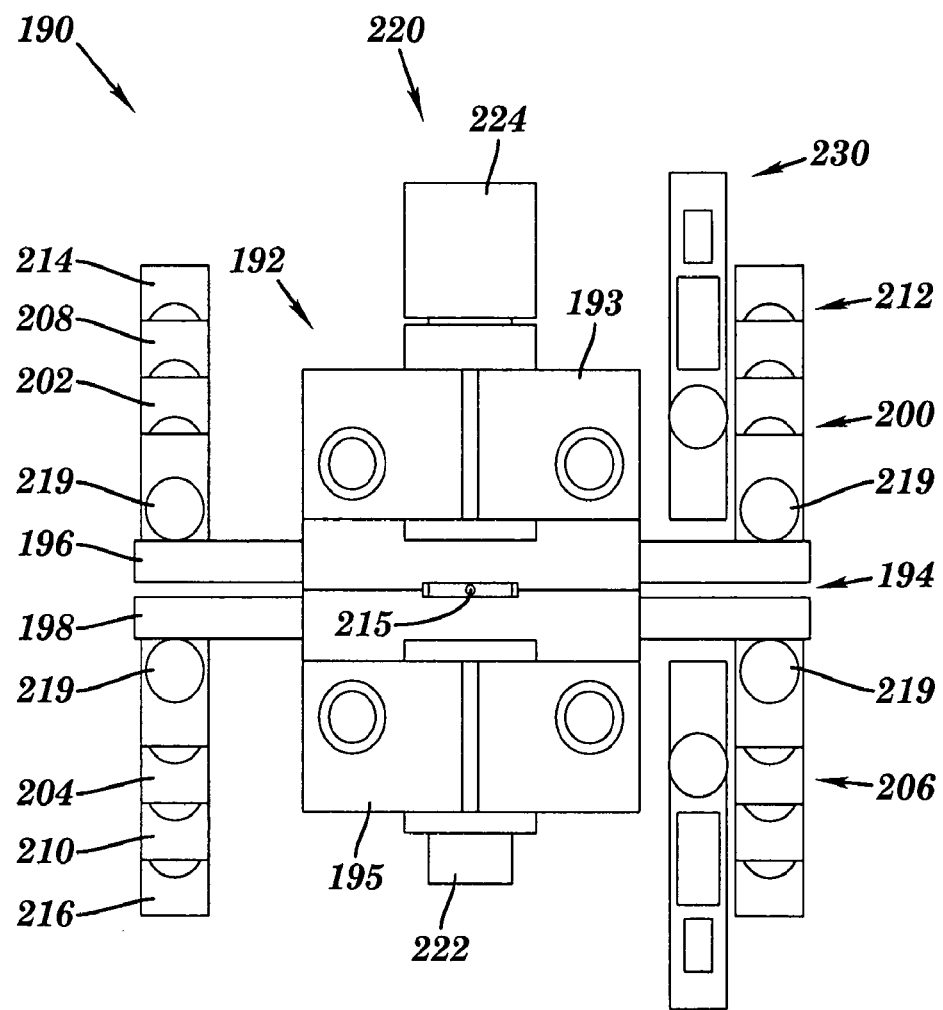
FIG. 19 is a top view of the blanker assembly shown in FIG. 16.
Figure 20:
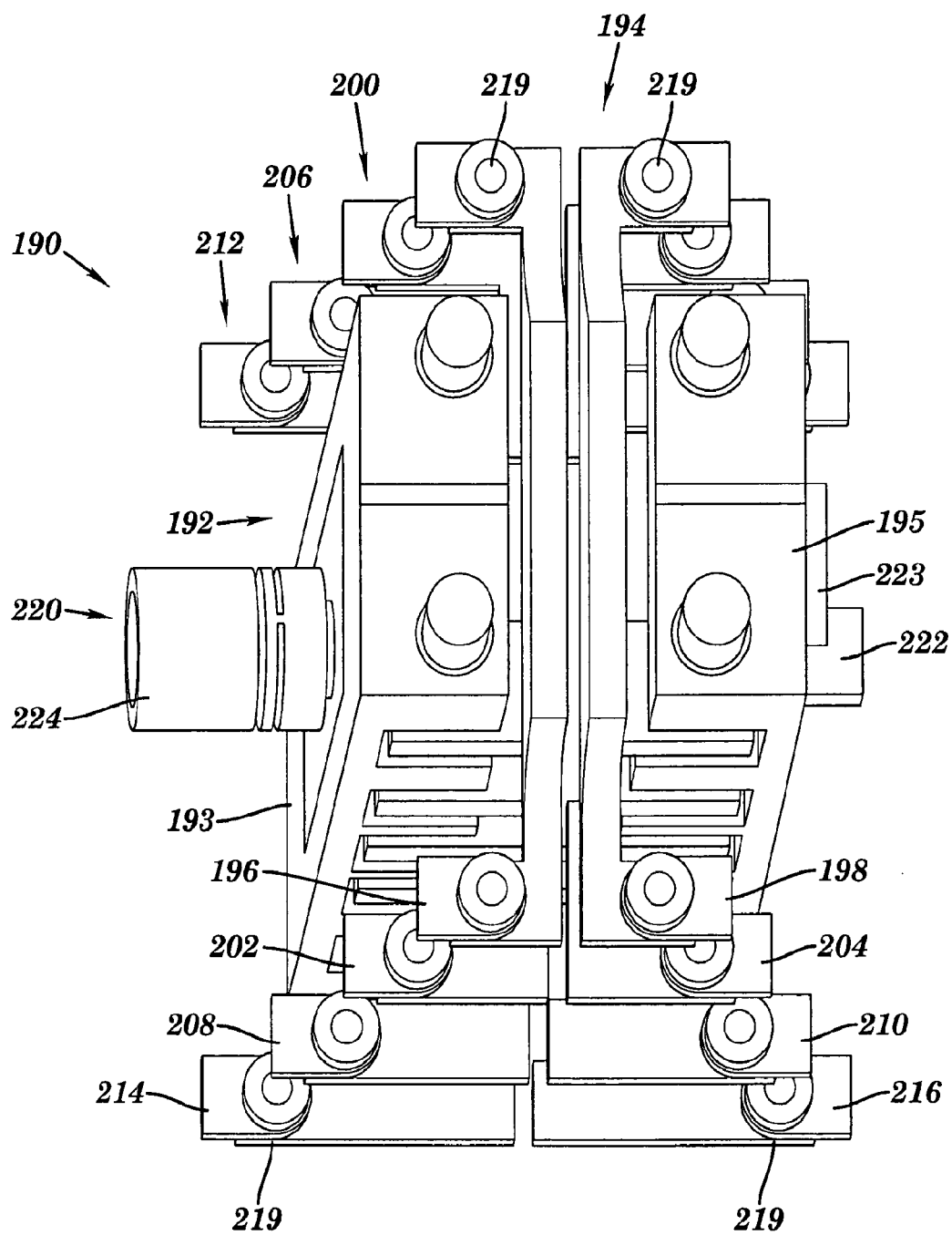
FIG. 20 is an oblique top view of the blanker assembly 190 shown in FIG. 16.

FIG. 17 is a right, front perspective view of the blanker assembly 190 shown in FIG. 16. FIG. 18 is a left, front perspective view of the blanker assembly 190 shown in FIG. 16. FIG. 19 is a top view and FIG. 20 is an oblique top view of the blanker assembly 190 shown in FIG. 16. According to one aspect of the invention, blanker assembly, or simply "blanker," 190 shown in FIGS. 17-20 may comprise a multiple-deflection blanker for charged particle beam lithography, for example, for electron beam lithography (EBL). In another aspect of the invention, blanker assembly 190 may comprise a charged particle manipulation device. Regardless of the name or function of blanker assembly 190 shown in FIGS. 17-20, in the following discussion, blanker assembly 190 will be referred to as "blanker 190," though it will be understood that the device shown and described may be used for manipulating any charged particle stream in addition to EBL "blanking"

As shown in FIGS. 17-20, blanker 190 includes a support structure 192, a first pair 194 of electrodes 196 and 198 mounted to the support structure 192. The electrodes 196 and 198 in the first pair 194 of electrodes are typically spaced from each other and are adapted to provide a first electric field between the electrodes 196 and 198. The blanker 190 also includes a second pair 200 of electrodes 202 and 204 mounted to the support structure 192 and electrically isolated from the first pair 194 of electrodes. The electrodes 202 and 204 in the second pair 200 of electrodes are typically spaced from each other and are adapted to provide a second electric field between the electrodes 202 and 204. The blanker 190 also includes at least one third pair 206 of electrodes 208 and 210 mounted to the support structure 192 and electrically isolated from the second pair 200 of electrodes. The electrodes 208 and 210 in the third pair 206 of electrodes are also typically spaced from each other and are adapted to provide a third electric field between the electrodes 208 and 210.

As shown in FIGS. 17-20, in one aspect, blanker 190 may include at least a fourth pair 212 of electrodes 214 and 216 mounted to the support structure 192 and electrically isolated from the third pair 206 of electrodes. The electrodes 214 and 216 in the fourth pair 212 of electrodes are also typically spaced from each other and are adapted to provide a fourth electric field between the electrodes 214 and 216. Electrodes 196, 198, 202, 204, 208, 210, 214, and 216 may typically comprise parallel-plate type electrodes, that is, electrodes comprising conductive flat plates spaced to provide a gap between the plates through which charged particles can be directed and across which an electric filed can be provided. The lateral spacing between any two electrodes in a pair of electrodes typically ranges from about 1 mm to about 5 mm, for example, about 2 mm.

Electric power, for example, about 1 to about 5 volts direct current (VDC), for example, about 2 VDC, from an electric power source (not shown) may be provided to these electrodes 196, 198, 202, 204, 208, 210, 214, and 216 by means of one or more terminals 219, for example, threaded fasteners threaded into an extension of electrodes 196, 198, 202, 204, 208, 210, 214, and 216. As shown in FIGS. 17-20, two terminals 219 may be provided with wire connecting points to each electrode. One of the terminals may serve as a signal injecting point, and the other terminal may serve as a connecting point to termination. Electrodes 196, 198, 202, 204, 208, 210, 214, and 216 may be made from any conducting material, for example, copper. In one aspect, electrodes 196, 198, 202, 204, 208, 210, 214, and 216 may be made from oxygen-free copper or beryllium-copper, or their equivalent.

As shown most clearly in FIGS. 19 and 20, the electrodes 196, 198, 202, 204, 208, 210, 214, and 216 of the first pair 194 of electrodes, the second pair 200 of electrodes, and the third pair 212 of electrodes include electric power terminals 219, wherein the position of the terminals 219 of the third pair of electrodes 206 is distal the position of the terminals 219 of the second pair 200 of electrodes and a position of the terminals of the second pair 200 of electrodes is distal the position of the terminals 219 of the first pair 194 of electrodes. This "step out" placemat of the terminals 219 facilitates access to the terminals, again, for example, threaded fasteners.

Support structure 192 may comprise a first support 193 and second support 195 adapted to support and retain electrode pairs 194, 200, 206, and 212. Supports 193 and 195 are typically made from an electrically insulating material to electrically isolate electrode pairs 194, 200, 206, and 212, for example, a ceramic or a plastic. Since blanker 190 will be exposed to vacuum, the electrically insulating material is preferably a vacuum-compatible ceramic or a vacuum-compatible plastic, such as, a UV-curable resin provided by DSM Somos, or its equivalent.

Support structure 192 may include a plurality of positioning rods 197. Positioning rods 197 function to accurately position blanker 190, for example, accurately position blanker 190 within vacuum chamber 172. Since the vacuum chamber 172 is positioned relative to electron beam with high accuracy, positioning rods 197 can be used to precisely control the positioning of electrode plates with respect to the electron or charged particle beam. Positioning rods 197 may typically be made from an electrically insulating material, for example, a ceramic or plastic. Rods 197 may be fabricated by a high-accuracy grinding process.

According to aspects of the invention, blanker 190 will also include some form of surface 215 (see FIG. 19, an similar to surface 108 in FIGS. 7-9) positioned to obstruct a charged particle beam that passed through any one or more of the first electric field, the second electric field, the third electric filed, and/or the fourth electric field. In the aspect of the invention shown in FIGS. 17-20, the surface upon which the charged particle beam or electron beam is directed, for example, to turn the beam "off," is positioned in blanker 190 by an aperture holder 220. Aperture holder 220, the details of which will be provided below with respect to FIGS. 21-23, includes a first end 222 which is inserted into and retained by support structure 192 and a second end 224 that projects out of support structure 192, for example, to facilitate insertion, removal, and/or adjustment of the position of aperture holder 220. In one aspect of the invention, the second end 224 of aperture holder 220 may be coupled to a displacement device (not shown), for example, a linear displacement transducer (LDT) to allow a linear motion feed through of aperture holder 220 in blanker 190. This typicality automated device may be used to provide adjustment of the position of the surface, for example, an aperture, in blanker 190. As shown most clearly in FIG. 18, the first end 22 of aperture holder 220 may be positioned in blanker 190 by one or more plates 223 mounted to support 192. Plates 223 may limit or prevent the movement or rotation of the aperture holder 220. For example, in one aspect plates 223 may be resilient plates, for instance, spring plates, for example, copper spring plates.

As discussed more fully below, according to one aspect of the invention, aperture holder 220 includes an surface, aperture, orifice, or knife edge that is positionable within support structure 192, for example, removably and adjustably positionable within support structure 192, and provides the surface upon which blanker 190 is adapted to direct the beam of charged particles. In one aspect, the surface, that is, the aperture, the orifice, or the knife edge, is positioned between the second pair 200 of electrodes and the third pair 206 of electrodes and the surface is positioned to obstruct a charged particle beam deflected by the second electric field of the second pair 206 of electrodes.

In one aspect of the invention, blanker 190 may include a termination assembly 230, for example, as shown in FIGS. 17, 18, and 19. Termination assembly 230 functions as a support and interface to host the electronic termination components. For example, in one aspect, each tier 232 of a plurality of tiers 232 of the termination assembly 230 includes an insulator, for example, a ceramic insulator, and may include electrical components, for example, surface-mounted electronic (SMT) components. The components may be resistors and/or capacitors, for example, 50Ω resistors and capacitors, with appropriate power ratings. FIG. 19 shows the relative position of the termination assembly 230 with respect to the support structure 192 and electrode pairs 194, 200, 206, and 212.

Though not shown in FIGS. 17-20, aspects of the invention may typically include means for regulating the timing and/or voltage of the electric power to electrodes 196, 198, 202, 204, 208, 210, 214, and 216, for example, to effect the desired time delay in energizing electrodes 196, 198, 202, 204, 208, 210, 214, and 216 as discussed above. Electric power to at least one electrode of each of the pair of electrodes may be provided by an appropriate voltage controller or regulator.

According to aspects of the invention, a multiple-deflection blanker 190, for example, a "quadruple-deflection" blanker, is provided that is effective with high blanker deflection speeds, for example, with deflection speeds higher than 1 gigahertz [GHz]. However, aspects of the invention may also be employed at lower deflection speeds, for example, between 50 megahertz [MHz] to 1 GHz, and aspects of the invention may also be used for systems with less than 50 MHz deflection speeds.

Figure 23:
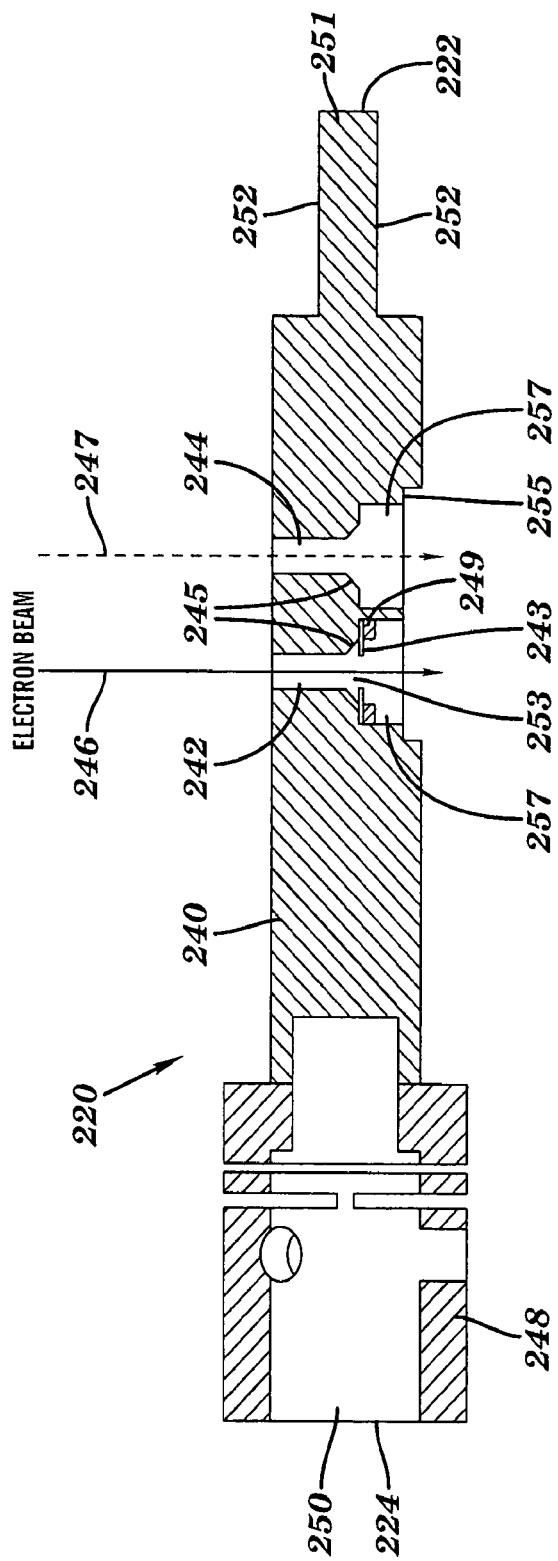
FIG. 23 is side elevation view in cross section of the aperture holder shown in FIGS. 17-20.

FIG. 21 is a top perspective view of the aperture holder 220 shown in FIGS. 17-20 according to one aspect of the invention. FIG. 22 is a bottom perspective view of the aperture holder 220 shown in FIGS. 17-20 and FIG. 23 is side elevation view in cross section of the aperture holder 220. As noted earlier, aperture holder 220 includes a first end 222 having a coupling mechanism mounted to the first end of the cylindrical member, the coupling mechanism is configured to mount the aperture holder to the support 192 of blanker 190. For example, first end 22 may be adapted to be inserted into and retained by support structure 192 of blanker 190. Aperture holder 220 includes a second end 224, opposite the first end 222, which projects out of support structure 192, for example, to facilitate insertion and removal or coupling to a displacement device, for example, an automated displacement device. As shown in FIGS. 21-23, aperture holder 220 may include a cylindrical body or member 240, for example, a circular cylindrical body or a polygonal cylindrical body, having at least one, and typically, at least two, through holes 242 and 244, for example, transverse through holes. Through holes 242 and 24 are positioned between the first end 222 and the second end 224 and positioned to align with an electron beam (or charged particle beam) 246 and 247 shown in FIGS. 21-23. Through holes 242 and 244 may comprises holes having a centerline substantially perpendicular to the axis of elongation of the cylindrical body or member 240. Though holes 242 and 244 are adapted to retain or mount an aperture or knife edge 243 which provides a surface positioned to obstruct the electron (or charged particle) beam 246 (and/or 247). For example, as shown in FIGS. 22 and 23, through hole 242 may contain an aperture 243 positioned to interfere with a beam 246 and the aperture may be omitted from through hole 244, for example, for calibration and testing. In one aspect, through holes 242 and 244 may both contain apertures 243, or neither may contain an aperture. According to aspects of the invention, aperture holder 220 may be translatable, for example, axially translatable, to vary the position of holes 242 ad 244 relative to beams 246 and/or 247.

As shown most clearly in the cross section of FIG. 23, through holes 242 and 244 may include a conical expansion 245 from a smaller diameter, for example, about 1 mm, to a larger diameter, for example, about 3 mm, of a counter bore 247 in a flat surface 255. According to aspects of the invention, counter bore 247 is adapted to retain aperture 243, for example, removably retain aperture 243 by means of retaining device or retaining ring 249. As shown in FIG. 23, aperture 243 may comprise a thin plate having an opening 253 of the desired dimension, for example, a circular dimension. Opening 253 in aperture 243 may typically have a diameter of between about 0.5 mm and about 2 mm, for example, about 1 mm. In one aspect, as shown in FIG. 23 aperture 243 may be used "up-side down." In another aspect, backscatter electrons from the aperture 243 may be reduced by the use of a Faraday cage structure, as known in the art.

First end 224 may comprise a cylindrical structure 248, for example, a circular cylindrical structure, adapted to be manually handled or to engage a displacement device. For example, second end 224 may include a coupling device, for example, a flexible coupling device. Second end 224 may be hollow and include an internal cavity 250. First end 222 may include a rotation limiting device. For example, first end 222 may include a projection 251 having a least one, but typically, two, planar surfaces 252 adapted to engage a retaining structure in blanker 190, for example, to engage plates 223 (FIG. 18) on blanker 190, to limit or prevent rotation of aperture holder 220.

Aspects of the present invention provide methods, apparatus, devices, and systems for manipulating charged particle streams, for example, electron streams, and/or ion streams. It will be understood by those of skill in the art that the charged particle streams manipulated or "blanked" (that is, blocked or obstructed) by aspects of the invention may comprise charged particle "beams," for example, it is known in the art that one definition of "beam" is "a stream of particles." Aspects of the invention are can be applied to EBL, for example, for nanofabrication of semiconductor based materials and structures.

According to some aspects of the invention, the surface onto which the beam of charged particles is directed or impacted (for example, the aperture) may be positioned between sets of pairs of electrodes, for example, between sets of vertically spaced pairs of electrodes, or positioned external the sets of paired electrodes, for example, above or below sets of vertically spaced pairs of electrodes.

As will be appreciated by those skilled in the art, features, characteristics, and/or advantages of the various aspects described herein, may be applied and/or extended to any embodiment (for example, applied and/or extended to any portion thereof).

Although several aspects of the present invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

The invention claimed is:

1. A multiple-deflection blanker for charged particle beam lithography, the blanker comprising:
   a support structure;
   a first pair of electrodes mounted to the support structure, the electrodes in the first pair of electrodes spaced from each other and adapted to provide a first electric field between the electrodes of the first pair of electrodes;
   a second pair of electrodes mounted to the support structure and electrically isolated from the first pair of electrodes, the electrodes in the second pair of electrodes spaced from each other and adapted to provide a second electric field between the electrodes of the second pair of electrodes;
   at least a third pair of electrodes mounted to the support structure and electrically isolated from the second pair of electrodes, the electrodes in the third pair of electrodes spaced from each other and adapted to provide a third electric field between the electrodes of the third pair of electrodes; and
   a surface positioned to obstruct a charged particle beam passed through any one of the first electric field, the second electric field, and the third electric field.

2. The blanker as recited in claim 1, wherein the blanker further comprises at least a fourth pair of electrodes mounted to the support structure and electrically isolated from the third pair of electrodes, the electrodes in the fourth pair of electrodes spaced from each other and adapted to provide a fourth electric field between the electrodes of the fourth pair of electrodes.

3. The blanker as recited in claim 1, wherein the blanker further comprises means for regulating at least one of timing and amplitude of electric power provided to at least one electrode of each of the pair of electrodes.

4. The blanker as recited in claim 1, wherein the surface comprises one of an edge of an aperture and a knife edge.

5. The blanker as recited in claim 1, wherein the surface is positioned between the second pair of electrodes and the third pair of electrodes and the surface is positioned to obstruct a charged particle beam deflected by the second electric field of the second pair of electrodes.

6. The blanker as recited in claim 1, wherein the blanker comprises means for producing a substantially telecentric beam of charged particles.

7. A blanker assembly comprising:
   an outer housing configured to mount into a lithographic column assembly;
   an inner housing configured to mount into the outer housing; and the blanker as recited in claim 1 mounted in the inner housing, the blanker positioned to receive a beam of charged particles and transmit at least some of the charged particles though an opening in the inner housing and through an opening in the outer housing.

8. A method for exposing a medium to charged particles, the method comprising:
   directing a beam of the charged particles in a beam direction upon the medium;
   electrostatically deflecting at least some of the charged particles in a first direction substantially perpendicular to the beam direction;
   electrostatically deflecting at least some of the charged particles deflected in the first direction in a second direction different from the first direction;
   selectively impacting the charged particles deflected in the second direction upon a surface or avoiding impacting the charged particles deflected in the second direction upon the surface; and when impacting is selectively avoided, deflecting at least some of the charged particles deflected in the second direction in a third direction different from the second direction, wherein at least some of the charged particles deflected in the third direction contact the medium.

9. The method as recited in claim 8, wherein the method further comprises deflecting at least some of the charged particles deflected in the second direction in a fourth direction substantially parallel to the second direction, wherein at least some of the charged particles deflected in the fourth direction contact the medium.

10. A method for exposing a medium to charged particles, the method comprising:
    directing a beam of the charged particles in a beam direction upon the medium;
    electrostatically deflecting at least some of the charged particles in a first direction substantially perpendicular to the beam direction;
    electrostatically deflecting at least some of the charged particles deflected in the first direction in a second direction substantially parallel to the first direction;
    electrostatically deflecting at least some of the charged particles deflected in the second direction in a third direction substantially parallel to the first direction; and
    impacting one of the charged particles deflected in the first direction, the charged particles deflected in the second direction, and the charged particles deflected in the third direction upon a surface to minimize exposure of the medium to charged particles.

11. The method as recited in claim 10, further comprising, after electrostatically deflecting at least some of the charged particles in the second direction, electrostatically deflecting at least some of the charged particles deflected in the second direction in a fourth direction substantially parallel to the first direction.

12. A charged particle manipulation device comprising:
    means for providing a first electric field wherein a charged particle passing through the first electric field is at least partially deflected by the first electric field in a first direction;
    means for providing a second electric field wherein the charged particle deflected by the first electric field is at least partially deflected by the second electric field substantially in a second direction different from the first direction;
    a surface positioned to obstruct the charged particles deflected by the second electric field; and means for providing a third electric field, wherein charged particles deflected by the second electric field are at least partially deflected by the third electric field substantially in a third direction substantially parallel to the first direction.

13. The device as recited in claim 12, wherein the device further comprises means for providing a fourth electric field, positioned between the means for providing the second electric field and the means for providing the third electric field, and wherein the charged particle deflected by the second electric field is at least partially deflected by the fourth electric field substantially in a fourth direction different form the first direction.

14. A charged particle manipulation device comprising:
- means for providing a first electric field wherein a charged particle passing through the first electric field is at least partially deflected by the first electric field in a first direction;
- means for providing a second electric field wherein the charged particle deflected by the first electric field is at least partially deflected by the second electric field substantially in a second direction substantially parallel to the first direction;
- means for providing at least one third electric field, wherein a charged particle passing the surface is at least partially deflected by the third electric field in a third direction substantially parallel to the first direction; and
- a surface positioned to obstruct the charged particles deflected at least one of the first electric field, the second electric field, and the third electric field.

15. The device as recited in claim 14, wherein the means for providing at least one third electric field comprises means for providing the third electric field and a fourth electric field, wherein the charged particles passing the third electric field at least partially deflected by the fourth electric field in a fourth direction substantially parallel to the first direction.

16. An electron beam lithography system comprising:
- a source of electron beam;
- one or more lenses adapted to focus the electron beam; and
- the charged particle manipulation device as recited in claim 14.

17. The electron beam lithography system as recited in claim 16, further comprising at least one of:
- a stigmator for correcting any astigmatism in the electron beam;
- one or more apertures adapted to define the electron beam;
- an alignment system for centering the electron beam; and
- an electron detector adapted to focus and locate marks on a sample exposed to the electron beam.

* * * * *